United States Patent
Chang et al.

(10) Patent No.: US 10,792,904 B2
(45) Date of Patent: Oct. 6, 2020

(54) METHOD FOR BONDING ONE COMPONENT TO ANOTHER COMPONENT

(71) Applicant: NATIONAL SUN YAT-SEN UNIVERSITY, Kaohsiung (TW)

(72) Inventors: Ting-Chang Chang, Kaohsiung (TW); Chih-Cheng Shih, Kaohsiung (TW); Ming-Hui Wang, Kaohsiung (TW); Wen-Chung Chen, Kaohsiung (TW); Chih-Yang Lin, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 18 days.

(21) Appl. No.: 16/016,802

(22) Filed: Jun. 25, 2018

(65) Prior Publication Data
US 2019/0291401 A1    Sep. 26, 2019

(30) Foreign Application Priority Data
Mar. 22, 2018   (TW) .............................. 107109874 A

(51) Int. Cl.
*B32B 37/10* (2006.01)
*B32B 43/00* (2006.01)
*H01L 21/18* (2006.01)

(52) U.S. Cl.
CPC ........ *B32B 37/1009* (2013.01); *B32B 43/006* (2013.01); *H01L 21/187* (2013.01)

(58) Field of Classification Search
CPC . B32B 37/1009; B32B 37/10; B32B 2457/14; H01L 21/02
See application file for complete search history.

(56) References Cited

U.S. PATENT DOCUMENTS

| | | | |
|---|---|---|---|
| 8,822,817 B2 | 9/2014 | Bhusari et al. | |
| 2004/0112406 A1* | 6/2004 | Cotte | B08B 7/0021 134/4 |
| 2008/0006291 A1 | 1/2008 | Watanabe | |
| 2011/0097576 A1* | 4/2011 | Habu | C09J 7/22 428/336 |
| 2017/0018450 A1* | 1/2017 | Tang | B05D 1/005 |
| 2018/0005922 A1 | 1/2018 | Levesque, Jr. et al. | |

* cited by examiner

*Primary Examiner* — Christopher T Schatz
(74) *Attorney, Agent, or Firm* — WPAT, PC

(57) ABSTRACT

A method for bonding a first component to a second component includes placing the first and second components in a cavity. Each of the first and second components has a bonding portion, and the bonding portion of the first component faces the bonding portion of the second component. A supercritical fluid is then introduced into the cavity with a temperature of 40-400° C. and a pressure of 1,500-100,000 psi, and a pressure of 4-100,000 psi is applied on both the first and second components, assuring the bonding portion of the first component bond to the bonding portion of the second component. Moreover, a method for separating a first component from a second component includes placing a composite in a cavity. The composite includes the first component, the second component and a connecting layer by which the first component joins to the second component. The supercritical is then introduced into the cavity.

4 Claims, 4 Drawing Sheets

METHOD FOR BONDING ONE COMPONENT TO ANOTHER COMPONENT

CROSS REFERENCE TO RELATED APPLICATIONS

The application claims the benefit of Taiwan application serial No. 107109874, filed Mar. 22, 2018, the entire contents of which are incorporated herein by reference.

BACKGROUND OF THE INVENTION

1. Field of the Invention

The present invention generally relates to a method and, more particularly, to a method for bonding a component to another component. The present invention also relates to a method for separating a component from another component.

2. Description of the Related Art

In the semiconductor industry, a conventional method to bond a first component to a second component (such as to bond a first wafer to a second wafer), a worker can apply a pressure on both the first and second components at a temperature higher than 500° C. Relative bonding portions of the first and second components contact each other, forming covalent bonds between the two bonding portions. Thus, the first component bonds to the second component via the covalent bonds, obtaining a composite including the first and second components. However, in the situation that the first and second components are made of different materials, when the first and second components are processed at the temperature higher than 500° C., different level of thermal stress is formed on the first and second components. The difference between the level of thermal stress of the first and second components leads to fracture of the composite. Moreover, the temperature higher than 500° C. is not suitable for processing the components made of certain materials such as plastics.

On the other hand, the composite such as a glued substrate and a polyimide (PI)-glass composite substrate includes the first component, the second component and a connecting layer joining the first and second components. For such composite, the first component is generally separated from the second component by a mechanical strength or a chemical reaction. However, the mechanical strength or the chemical reaction may cause deformation or fracture of the first and/or second components. Therefore, the separated first and second components cannot be used in the following procedure.

In light of this, it is necessary to provide a method for bonding one component to another component, and a method for separating one component from another component.

SUMMARY OF THE INVENTION

It is therefore an objective of the present invention to provide a method for bonding one component to another component, suitable for bonding two components made of the material which cannot be processed at the temperature higher than 500° C., as well as the two components made of different material.

It is another objective of the present invention to provide a method for separating one component from another component, preventing from deformation or fracture of the two components.

One embodiment of the present invention discloses a method for bonding a first component to a second component. The method includes placing the first and second components in a cavity. Each of the first and second components has a bonding portion, and the bonding portion of the first component faces the bonding portion of the second component. A supercritical fluid is then introduced into the cavity with a temperature of 40-400° C. and a pressure of 1,500-100,000 psi. A pressure of 4-100,000 psi is applied on both the first and second components to assure that the bonding portion of the first component bond to the bonding portion of the second component. Accordingly, by the introduction of the supercritical fluid, the first component can bond to the second component in a relative low temperature (as an example, 40-400° C.) to form a composite. Therefore, the method is suitable for the first and/or second components made of the material which cannot be processed at the temperature higher than 500° C. Moreover, in the situation that the first and second components are made of different materials, the composite fractures due to the difference between the level of thermal stress on the first and second components.

In an example, the supercritical fluid is introduced into the cavity with the temperature of 350° C. and the pressure of 3,000 psi. As such, the supercritical fluid can remain to be in the supercritical state, and thus the bonding efficiency can be effectively improved.

In an example, the supercritical fluid introduced into the cavity is selected from the group consisting of supercritical carbon dioxide, supercritical tetrafluoromethane, supercritical argon, supercritical nitrogen, supercritical organic solvents and supercritical hydrocarbons. Moreover, before the supercritical fluid is introduced into the cavity, the supercritical fluid can be doped with a dope, which is selected from an element or a compound including the element, while the element is selected from a group consisting of hydrogen, nitrogen, phosphorus, arsenic, oxygen, sulfur, selenium, and halogens. As such, at the time that the first component bonds to the second components, defects on the first and second components can also be removed and thus the composite with fewer defects can be obtained.

Another embodiment of the present invention discloses a method for separating a first component from a second component. The method includes placing a composite in a cavity. The composite includes the first component, the second component and a connecting layer by which the first component joins to the second component. A supercritical fluid is then introduced into the cavity with a temperature of 40-400° C. and a pressure of 1,500-100,000 psi. Accordingly, the connecting layer between the first and the second components can be dissolved by the introduced supercritical fluid, resulting in the separation of the first and second components. As such, the first and second components can be separated without the problems such as deformation and fracture of the first and/or second components.

In an example, the supercritical fluid is introduced into the cavity with the temperature of 400° C. and the pressure of 4,000 psi. As such, the supercritical fluid can remain to be in the supercritical state, and thus the separating efficiency can be effectively improved.

In an example, the supercritical fluid introduced into the cavity is selected from the group consisting of supercritical carbon dioxide, supercritical tetrafluoromethane, supercritical argon, supercritical nitrogen, supercritical organic solvents and supercritical hydrocarbons. Moreover, before the supercritical fluid is introduced into the cavity, the supercritical fluid can be doped with a dope, which is an element or a compound including the element, while the element is selected from a group consisting of hydrogen, nitrogen, phosphorus, arsenic, oxygen, sulfur, selenium, and halogens. As such, at the time that the connecting layer is dissolved, defects on the first and second components can also be removed and thus the first/second components with fewer defects can be obtained.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1A:
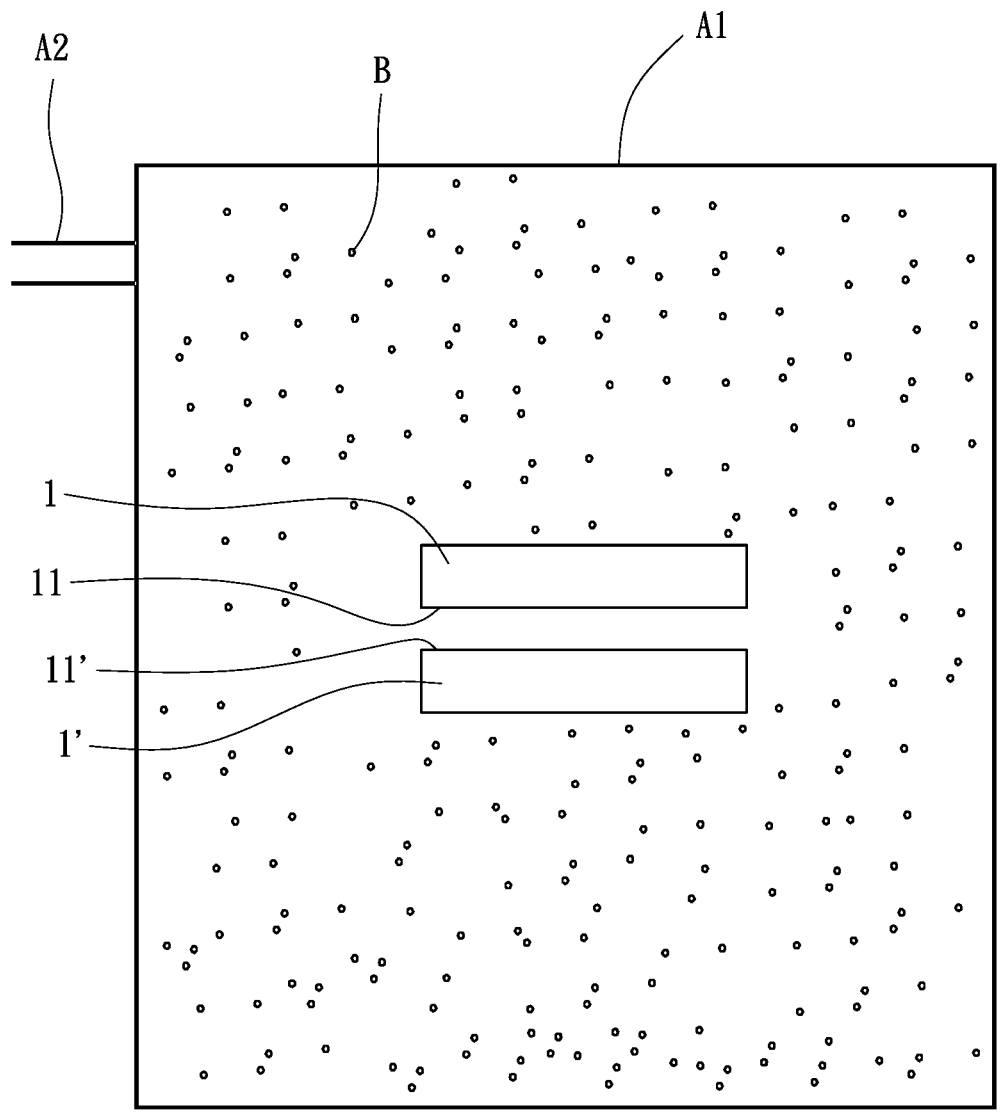
FIG. 1a depicts a schematic diagram demonstrating a first component separated from a second component before carrying out the method for bonding the first component to the second component.

In the various figures of the drawings, the same numerals designate the same or similar parts. Furthermore, when the term "first", "second" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

Figure 1B:
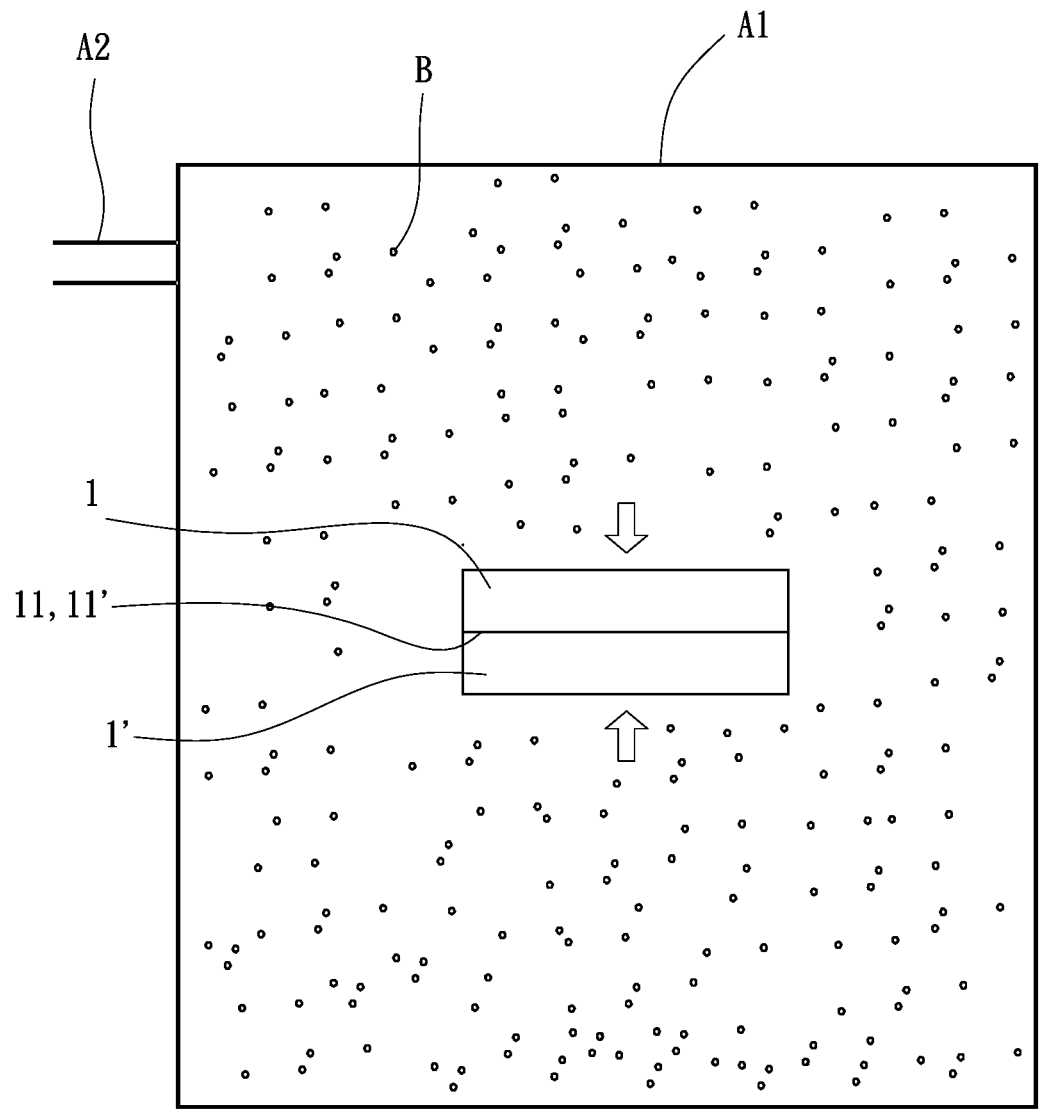
FIG. 1b depicts a schematic diagram demonstrating the first component bonding to the second component after carrying out the method for bonding the first component to the second component.

Referring to FIGS. 1a and 1b, a method for bonding a first component 1 to a second component 1' according to an embodiment of the invention includes: placing the first and second components 1, 1' in a cavity A1. A supercritical fluid B1 is then introduced into the cavity A1. A pressure is applied on both the first and second components 1, 1', resulting in the first component 1 bonding to the second component 1'.

Each of the first and second components 1, 1' has a bonding portion 11, 11'. When the first and second components 1, 1' are placed in the cavity A1, the bonding portion 11 of the first component 1 faces the bonding portion 11' of the second component 1'. Both the first and second components 1, 1' can be, but not limited to, made of crystalline silicon, III-V compounds (such as gallium arsenide (GsAs) and aluminum gallium arsenide (AlGaAs)), oxides (silicon dioxide ($SiO_2$) as an example) or metals, which can be appreciated by a person having ordinary skill in the art.

The supercritical fluid B can also include a dope, which is selected from the element consisting of hydrogen (H), nitrogen (N), phosphorus (P), arsenic (As), oxygen (O), sulfur (S), selenium (Se) and halogens and a compound including the element. As such, at the time that the first component 1 bonds to the second component 1', defects on the first and second components 1, 1' can also be removed. Moreover, the supercritical fluid B can be selected from a group consisting of supercritical carbon dioxide ($CO_2$), supercritical tetrafluoromethane ($CF_4$), supercritical argon (Ar), supercritical nitrogen ($N_2$), supercritical organic solvents (such as supercritical methanol, supercritical ethanol and supercritical acetone) and supercritical hydrocarbons (such as supercritical methane, supercritical ethane, supercritical propane, supercritical ethylene and supercritical propene).

In order to maintain the supercritical fluid B in the supercritical state and to prevent the supercritical fluid B from transforming into the gas state or the liquid state, the cavity A1 into which the supercritical fluid B is introduced has a temperature of 40-400° C. and a pressure of 1,500-100,000 psi. Preferably, the cavity A1 has the temperature of 400° C. and the pressure of 3,000 psi.

The pressure of 4-100,000 psi is applied to both the first and second components 1, 1', assuring the bonding portion 11 of the first component 11 bond to the bonding portion 11' of the second component 1'. As an example, a pressing machine or a strong magnet can be used to apply the pressure to both the first and second components 1, 1', which can be appreciated by a person having ordinary skill in the art.

Referring to FIGS. 1a and 1b, in this embodiment, the first and second components 1, 1' are placed in the cavity A1. The bonding portion 11 of the first component 1 faces the bonding portion 11' of the second component 1'. The temperature and the pressure in the cavity A1 are respectively adjusted to 350° C. and 3,000 psi, and the supercritical fluid B is then introduced into the cavity A1 through a fluid access hole A2. The pressure of 4 psi is applied on both the first and second components 1, 1' along directions indicated by arrows shown in FIG. 1b. At this time, the supercritical fluid B provides atoms to form covalent bonds between the bonding portions 11, 11', and a distance between the bonding portions 11, 11' is small enough to form the covalent bonds. Thus, the first component 1 binds to the second components 1' via the covalent bonds forming between the bonding portions 11, 11'.

Figure 2A:
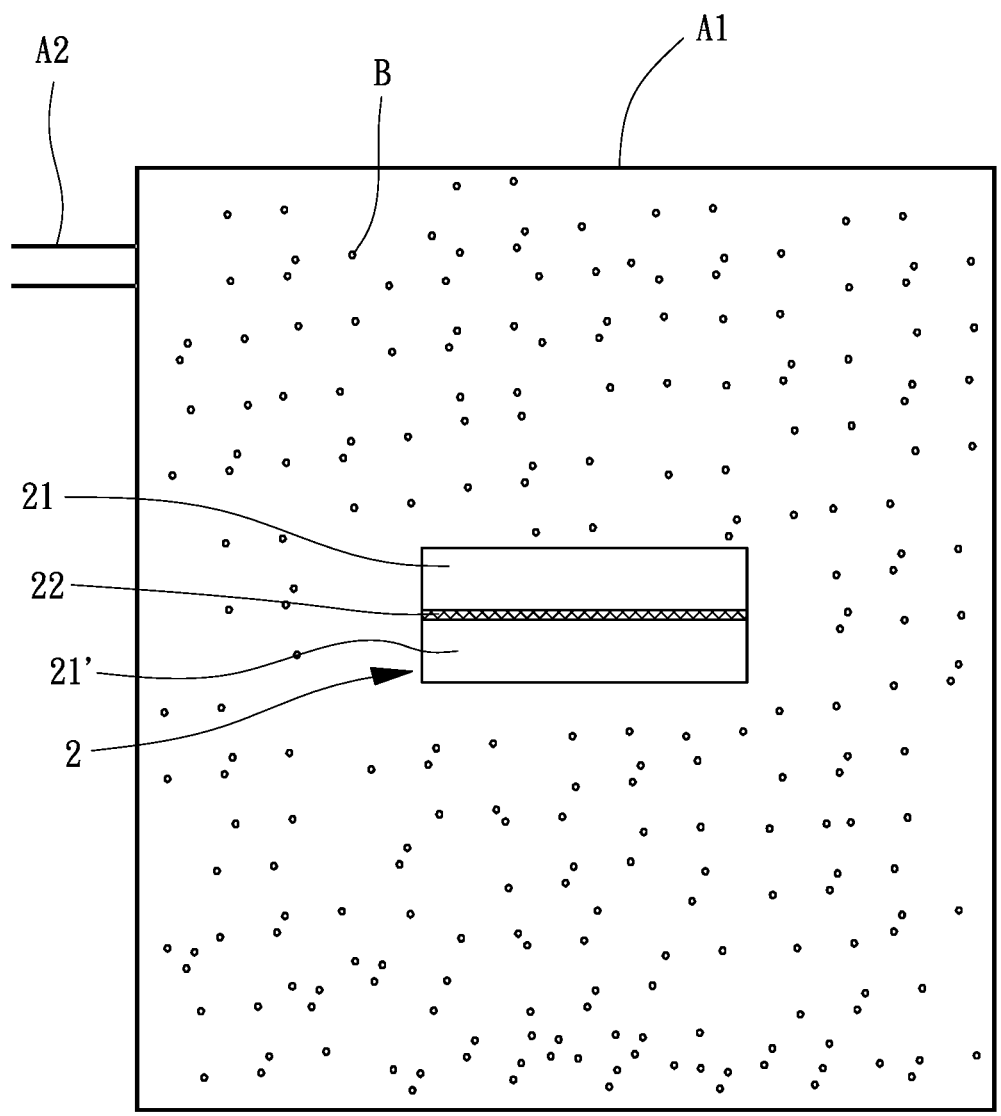
FIG. 2a depicts a schematic diagram demonstrating a composite including a first component joining to a second component via a connecting layer before carrying out the method for separating the first component from the second component.
Figure 2B:
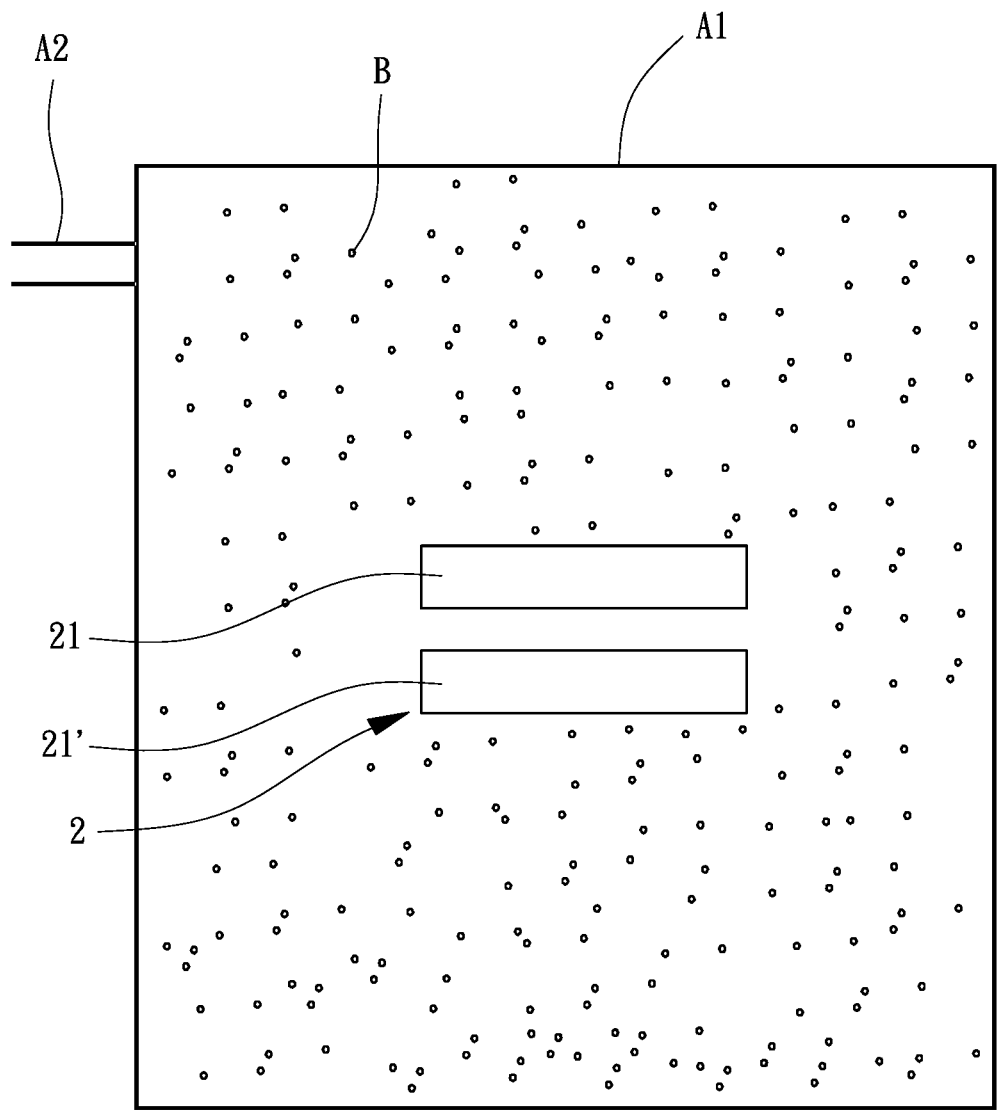
FIG. 2b depicts the first component separating from the second component after carrying out the method for separating the first component from the second component.

Referring to FIGS. 2a and 2b, a method for separating a first component 21 from a second component 21' according to an embodiment of the invention includes: placing a composite 2 in the cavity A1. The supercritical fluid B is then introduced into the cavity A1 with the composite 2 inside.

The composite 2 includes the first component 21, the second component 21' and a connecting layer 22 connecting the first and second components 21, 21'. The first and second components 21, 21' can be, but not limited to, made of silicon (Si), Si-containing compound such as silicon germanium (SiGe), silicon carbide (SiC), silicon nitride ($Si_3N_4$), silicon monoxide (SiO) and silicon dioxide ($SiO_2$), germanium (Ga), Ga-containing compound such as gallium nitride (GaN) and gallium arsenide (GaAs), aluminum oxide ($Al_2O_3$), indium phosphide (InP), molybdenum disulfide ($MoS_2$), graphene, and organic polymers such as poly(methyl methacrylate) (PMMA) and polyimide (PI), which can be appreciated by a person having ordinary skill in the art. Moreover, the connecting layer 22 can be formed by any conventional adhesive used for manufacturing semiconductors and can be dissolved by the supercritical fluid. As an example, the adhesive can, but not limited to, be made of a silver glue, a copper glue, a silicone glue, an organic gel, resin, or metals with melting point below 400° C. such as tin (Sn), indium (In) and germanium (Ga).

In order to maintain the supercritical fluid B in the supercritical state and to prevent the supercritical fluid B from transforming into the gas state or the liquid state, the cavity A1 into which the supercritical fluid B is introduced has a temperature of 40-400° C. and a pressure of 1,500-100,000 psi. Preferably, the cavity A1 has the temperature of 400° C. and the pressure of 4,000 psi. Moreover, the supercritical fluid B and the dope which can be added in the supercritical fluid B are the same as above-mentioned. Detail description is not given to avoid redundancy.

Referring to FIGS. 2a and 2b, in this embodiment, the composite 2 is placed in the cavity A1. The temperature and the pressure in the cavity A2 are respectively adjusted to 400° C. and 4,000 psi, and then, the supercritical fluid B is introduced into the cavity A1 through the fluid access hole A2. At this time, the connecting layer 22 is dissolved by the supercritical fluid B, and thus the first component 21 can be separated from the second component 21'.

Accordingly, by the introduction of the supercritical fluid, the first component can bond to the second component in a relative low temperature (as an example, 40-400° C.) to form a composite. Therefore, the method is suitable for the first and/or second components made of the material which cannot be processed at the temperature higher than 500° C. Moreover, in the situation that the first and second components are made of different materials, the fractures of the composite due to the difference between the level of thermal stress on the first and second components.

Moreover, the first and second components can be separated without the problems such as deformation and fracture of the first and/or second components.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A method for bonding a first component to a second component, wherein the first component and the second component are selected from the group consisting of crystalline silicon, gallium arsenide, aluminum gallium arsenide, oxides and metals, comprising:
    placing the first component and second component in a cavity, wherein the first component has a first bonding portion, the second component has a second bonding portion, and the first bonding portion of the first component is facing the second bonding portion of the second component;
    introducing a supercritical fluid into the cavity with a temperature of 40-400° C. and a pressure of 1,500-100,000 psi; and
    applying a pressure of 4-100,000 psi on both the first component and second component, wherein the first bonding portion of the first component is directly bonded to the second bonding portion of the second component via covalent bonds forming between the first bonding portion of the first component and the second bonding portion of the second component.

2. The method for bonding the first component to the second component as claimed in claim 1, wherein the supercritical fluid is introduced into the cavity with the temperature of 350° C. and the pressure of 3,000 psi.

3. The method for bonding the first component to the second component as claimed in claim 1, wherein the supercritical fluid introduced into the cavity is selected from the group consisting of supercritical carbon dioxide, supercritical tetrafluoromethane, supercritical argon, supercritical nitrogen, supercritical organic solvents and supercritical hydrocarbons.

4. The method for bonding the first component to the second component as claimed in claim 1, wherein before the supercritical fluid is introduced into the cavity, the supercritical fluid is doped with an element or a compound including the element, wherein the element is selected from the group consisting of hydrogen, nitrogen, phosphorus, arsenic, oxygen, sulfur, selenium and halogens.

* * * * *